US007554318B2

(12) United States Patent
Chen et al.

(10) Patent No.: US 7,554,318 B2
(45) Date of Patent: Jun. 30, 2009

(54) TRANSIENT REVERSING VOLTAGE DETECTING CIRCUIT

(75) Inventors: Mender Chen, Taipei (TW); Chien Cheng Lin, Taipei (TW)

(73) Assignee: Taipei Multipower Electronics Co., Ltd., Taipei (TW)

( * ) Notice: Subject to any disclaimer, the term of this patent is extended or adjusted under 35 U.S.C. 154(b) by 119 days.

(21) Appl. No.: 11/717,493

(22) Filed: Mar. 13, 2007

(65) Prior Publication Data

US 2008/0225446 A1 Sep. 18, 2008

(51) Int. Cl.
*G01R 31/02* (2006.01)
*H01H 31/02* (2006.01)
*H02H 3/20* (2006.01)

(52) U.S. Cl. ...................... 324/72.5; 324/555; 361/91.4

(58) Field of Classification Search ................ 324/72.5, 324/555; 361/91.4

See application file for complete search history.

(56) References Cited

U.S. PATENT DOCUMENTS 6,525,947 B2 * 2/2003 Umetsu et al. ........... 363/21.15
6,577,511 B2 * 6/2003 Yamaguchi et al. ...... 363/21.07

* cited by examiner

*Primary Examiner*—Timothy J Dole
(74) *Attorney, Agent, or Firm*—Charles E. Baxley

(57) ABSTRACT

A current balancing circuit includes a voltage detecting circuit having a detecting diode, and a control switch having an input part and an output part, the input part is coupled in series to the detecting diode and disposed opposite to the detecting diode for detecting abnormal and/or reverse voltages and for preventing electric circuits or facilities from being damaged by the abnormal and/or reverse voltages. The input part may be a photodiode having a positive or negative side coupled to the negative or positive side of the detecting diode. A resistor or a divider diode may be used to protect the voltage detecting circuit.

6 Claims, 5 Drawing Sheets

TRANSIENT REVERSING VOLTAGE DETECTING CIRCUIT

BACKGROUND OF THE INVENTION

1. Field of the Invention

The present invention relates to a current balancing circuit, and more particularly to a current balancing circuit including a simplified transient reversing voltage detecting circuit for detecting abnormal operation, such as in case of any open or short circuit happened on loads of the balancing circuit such that a transient reversing high voltage of back emf induced by the balancing transformer resulted accordingly, and/or reverse voltages and for preventing the current balancing circuit and/or the other electric circuits or facilities from being damaged by the abnormal and/or reverse voltages.

2. Description of the Prior Art

Typical current balancing circuits comprise an inverter coupled at one end thereof to various loads, a balance transformer circuit coupled to the other end of the inverter at a first terminal or coupling portion, the balance transformer circuit includes a number of balance transformers having the primary sides coupled together in series and having the secondary sides also coupled together in parallel, and the series primary sides and the parallel secondary sides are coupled together at a second terminal or coupling portion, the secondary sides of the balance transformers are also coupled to the loads.

A voltage detecting circuit is further provided and attached or coupled in parallel to the first and the second terminals or coupling portions for detecting whether the load is normal or not.

However, normally, the voltage detecting circuit may not be used to initialize or to actuate a control switch until a triggering capacitor has reached the predetermined voltage, such that the control switch may not be quickly actuated to operate the safety or protective circuit after the voltage detecting circuit has detected the abnormal and/or reverse voltages. In addition, the typical current balancing circuits comprise a number of parts or elements, which may greatly increase the manufacturing cost and which may be acted or responded slowly and which may judge incorrectly.

The present invention has arisen to mitigate and/or obviate the afore-described disadvantages of the conventional voltage detecting circuits.

SUMMARY OF THE INVENTION

The primary objective of the present invention is to provide a current balancing circuit including a simplified voltage detecting circuit for detecting abnormal and/or reverse voltages and for preventing electric circuits or facilities from being damaged by the abnormal and/or reverse voltages.

In accordance with one aspect of the invention, there is provided a current balancing circuit comprising a transient reversing voltage detecting circuit including a detecting diode having a positive side and a negative side, and a control switch including an input part and an output part, the input part being coupled in series to the detecting diode and disposed opposite to the detecting diode for detecting abnormal and/or reverse voltages and for preventing electric circuits or facilities from being damaged by the abnormal and/or reverse voltages.

The input part is preferably a photodiode, and the photodiode may include a negative side coupled to such as the negative side of the detecting diode, or the photodiode may alternatively include a positive side coupled to such as the positive side of the detecting diode.

The voltage detecting circuit may further include a resistor coupled to the input part of the control switch. The voltage detecting circuit may further include a divider diode coupled to the input part of the control switch. The voltage detecting circuit may further include a protective circuit coupled to the output part of the control switch.

The divider diode includes two poles arranged identical to that of the input part of the control switch. The input part includes a positive side coupled to a negative side of the divider diode, or includes a negative side coupled to a positive side of the divider diode.

Further objectives and advantages of the present invention will become apparent from a careful reading of the detailed description provided hereinbelow, with appropriate reference to the accompanying drawings.

DETAILED DESCRIPTION OF THE PREFERRED EMBODIMENT

Figure 1:
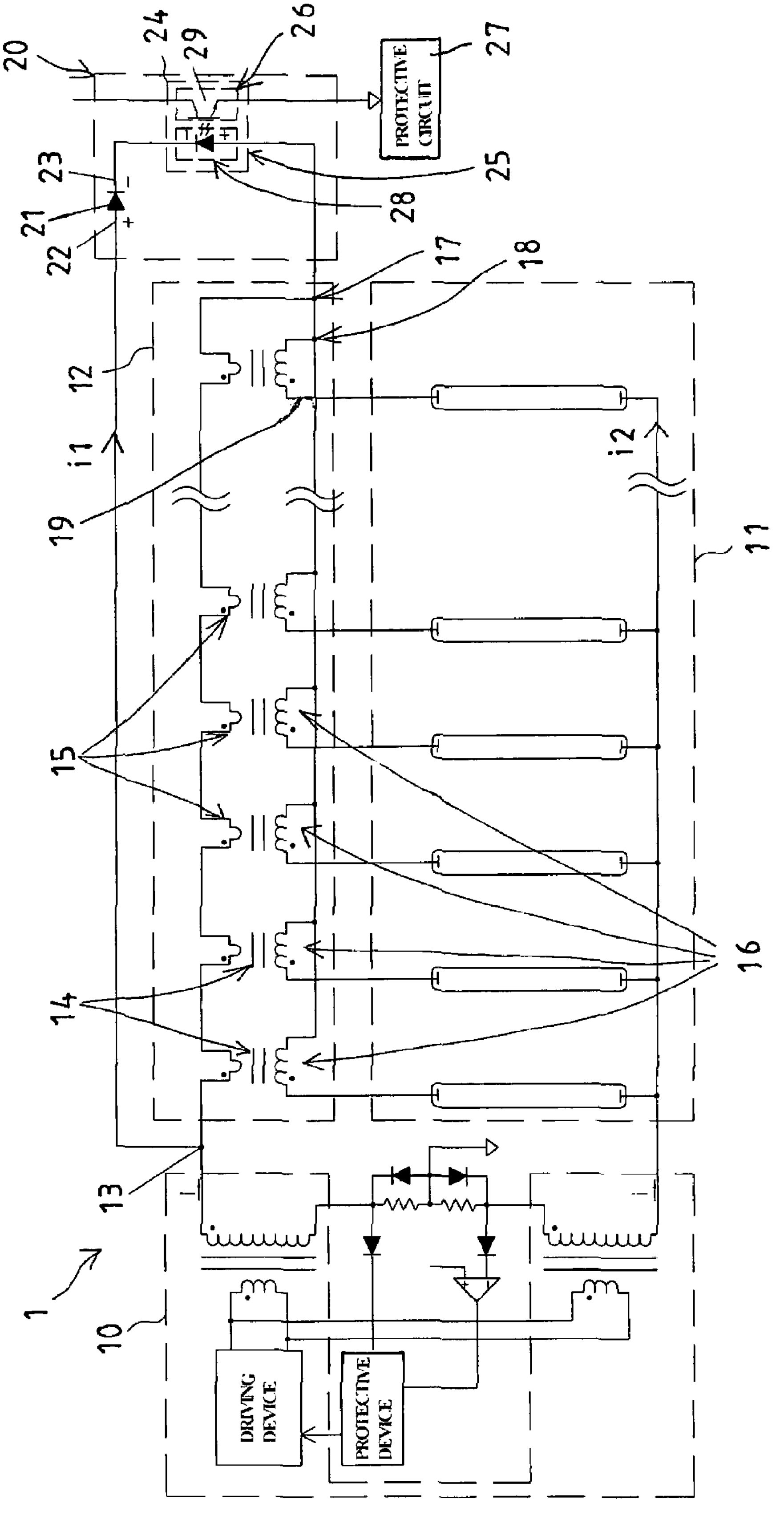
FIG. 1 is a plan schematic view of a current balancing circuit having a voltage detecting circuit in accordance with the present invention.
Figure 2:
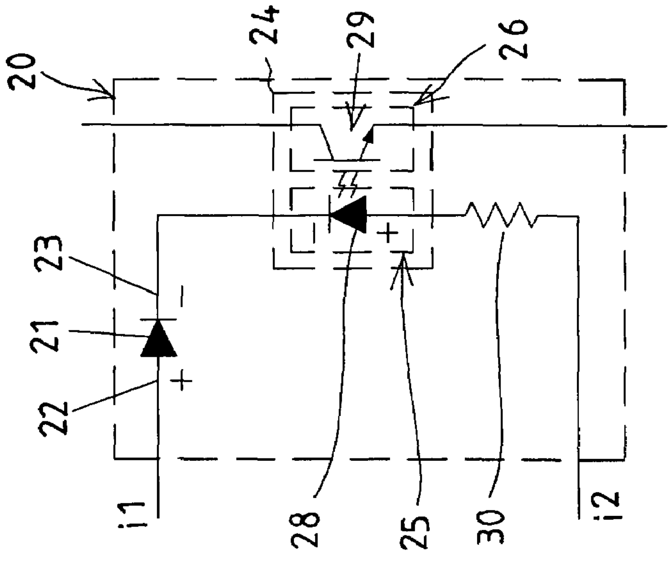
FIG. 2 is a partial plan schematic view of the voltage detecting circuit for the current balancing circuit.

Referring to the drawings, and initially to FIGS. 1 and 2, a current balancing circuit 1 in accordance with the present invention comprises an inverter 10 coupled at one end thereof to various loads 11, a balance transformer circuit 12 coupled to the other end of the inverter 10 at a first terminal or coupling portion 13, the balance transformer circuit 12 includes a number of balance transformers 14 having the primary sides 15 coupled together in series and having the secondary sides 16 also coupled together in parallel, and the series primary sides 15 and one terminals 18 of the parallel secondary sides 16 are coupled together at a second terminal or coupling portion 17, and the secondary sides 16 of the balance transformers 14 have the other terminals 19 also coupled to the loads 11.

A voltage detecting circuit 20 is further provided and attached or coupled in parallel to the first and the second terminals or coupling portions 13, 17, and includes a detecting diode 21 having a positive end or side 22 and a negative end or side 23, a control switch 24 having an input part 25 coupled in series to the detecting diode 21 and having an output part 26 for coupling to a protective circuit 27 or to an electric circuit or facility (not shown) to be controlled or protected with the protective circuit 27. The input part 25 may be or may include a photodiode 28 or the like which includes the poles disposed or arranged opposite to that of the detecting diode 21, and the output part 26 may be or may include a phototransistor 29 or the like.

The positive side 22 of the detecting diode 21 is coupled to the first terminal or coupling portion 13, the negative side 23 of the detecting diode 21 is coupled to the negative side of the photodiode 28 or the input part 25 of the control switch 24; i.e., the photodiode 28 or the input part 25 of the control switch 24 is coupled in series to the detecting diode 21 but disposed or arranged opposite to the detecting diode 21.

In operation, the inverter 10 may be actuated to supply two currents i1 and i2 alternatively through the first and the second terminals or coupling portions 13, 17 respectively, and/or alternatively through the detecting diode 21 and the photodiode 28 or the input part 25 of the control switch 24 respectively.

The electric current i1 is allowed or limited to flow from the positive side 22 to the negative side 23 of the detecting diode 21, but may not flow from the negative side to the positive side of the photodiode 28 or the input part 25 of the control switch 24 unless the electric current i1 is large enough or reaches the puncturing voltage to actuate or to puncture the photodiode 28 or the input part 25 of the control switch 24, and the phototransistor 29 of the output part 26 may be actuated or operated by the photodiode 28 or the input part 25 of the control switch 24 when the photodiode 28 or the input part 25 of the control switch 24 is punctured by the electric current i1. On the contrary, the electric current i2 is allowed or limited to flow from the positive side to the negative side of the photodiode 28 or the input part 25 of the control switch 24, but may not flow from the negative side 23 to the positive side 22 of the detecting diode 21.

When current balancing circuit 1 works properly, or when the load 11, such as the light tubes are energized properly, or when the currents moving through the load 11 and the balance transformer circuit 12 are balanced, or when the voltage difference between the first and the second terminals or coupling portions 13, 17 is relatively small or less, the voltage of the current i1 will not reach the puncturing voltage and thus may not actuate or puncture the photodiode 28 or the input part 25 of the control switch 24, such that the phototransistor 29 of the output part 26 may not be actuated or operated by the photodiode 28 or the input part 25 of the control switch 24 when the photodiode 28 or the input part 25 of the control switch 24 is not punctured by the electric current i1.

On the contrary, when the load 11 is abnormal or when the light tubes of the load 11 are not energized or operated properly, the currents moving through the primary sides 15 and the secondary sides 16 will be abnormal or unbalanced, and a back electromotive force may be induced and/or generated and the positive voltage at the other terminals 19 of the secondary sides 16 of the balance transformers 14 will be increased, and same things happened at the primary sides 15 terminals of the balance transformers 14, such that the voltage difference between the first and the second terminals or coupling portions 13, 17 will also be increased, and when the voltage difference between the first and the second terminals or coupling portions 13, 17 is increased and reaches the puncturing voltage, the photodiode 28 or the input part 25 of the control switch 24 may be actuated or punctured, and the electric current i1 may then flow through the second terminals or coupling portion 17 to form a circuit.

When the photodiode 28 or the input part 25 of the control switch 24 is punctured by the electric current i1, the phototransistor 29 of the output part 26 may be actuated or operated by the photodiode 28 or the input part 25 of the control switch 24, and the protective circuit 27 may then may be actuated or operated by the phototransistor 29 or the output part 26 of the control switch 24 to such as switch off the electric circuit or facility and to protect and to prevent the electric circuit or facility from being damaged by the abnormal voltage.

Figure 9:
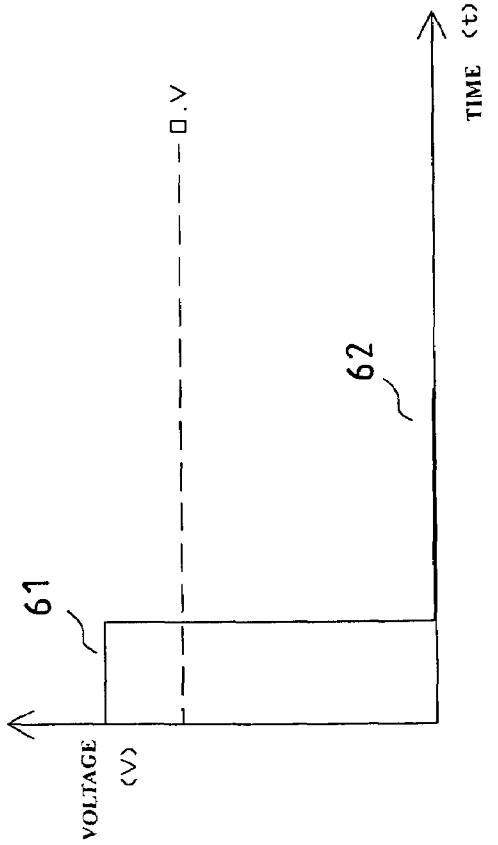
FIG. 9 is a plan schematic view illustrating the operation or the testing result of the voltage of the voltage detecting circuit.
Figure 10:
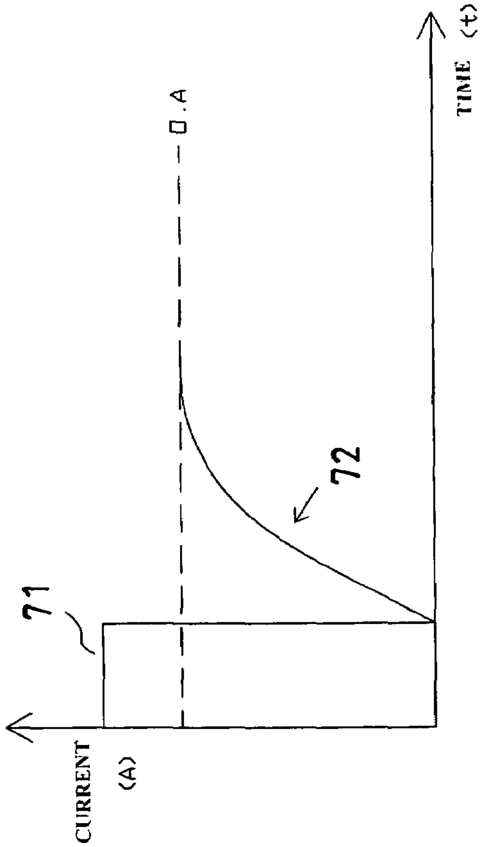
FIG. 10 is a plan schematic view illustrating the operation or the testing result of the current of the voltage detecting circuit.

For example, as shown in FIGS. 9 and 10, when the electric current i1 is a positive current 71 (FIG. 10) with a positive voltage 61 (FIG. 9), a forward bias may be formed and the electric current i1 is allowed or limited to flow from the positive side 22 to the negative side 23 of the detecting diode 21.

When the load 11 is abnormal or when the light tubes of the load 11 are not energized or operated properly, and when the electric current is changed to the electric current i2 or changed to the reverse bias or the negative voltage 62 (FIG. 9), or when the electric current i2 is supplied through the load 11, the negative voltage at the terminals 18 of the secondary sides 16 of the balance transformers 14 will be decreased or will be more negative, and same things happened at the primary sides 15 terminals of the balance transformers 14, such that the voltage difference between the first and the second terminals or coupling portions 13, 17 will also be increased, and the electric current i2 may flow from the positive side to the negative side of the photodiode 28.

In addition, in the previous moment when the electric current i1 flows through the detecting diode 21, a great amount of electricity or electric charges will be accumulated in the electrodes of detecting diode 21, and simultaneously when the electric current is changed to the electric current i2, the great amount of electricity accumulated in the detecting diode 21 will be released to generate the great negative current 72 (FIG. 10) and the transient reversing current may then flow through the detecting diode 21 and flow backward toward the first terminal or coupling portion 13 to form a circuit. When the electric current i2 flows through the photodiode 28 or the input part 25 of the control switch 24, the photodiode 28 or the input part 25 of the control switch 24 may be actuated or operated to generate a light or a signal in order to actuate or operate the phototransistor 29 of the output part 26 of the control switch 24 and so as to switch off the electric circuit or facility and to protect and to prevent the electric circuit or facility from being damaged by the abnormal voltage.

As shown in FIG. 2, a resistor 30 may further be provided and coupled between the second terminal or coupling portion 17 and the photodiode 28 or the input part 25 of the control switch 24 in order to limit the electric current or to prevent the abnormal electric current from flowing through the photodiode 28 or the input part 25 of the control switch 24.

Figure 3:
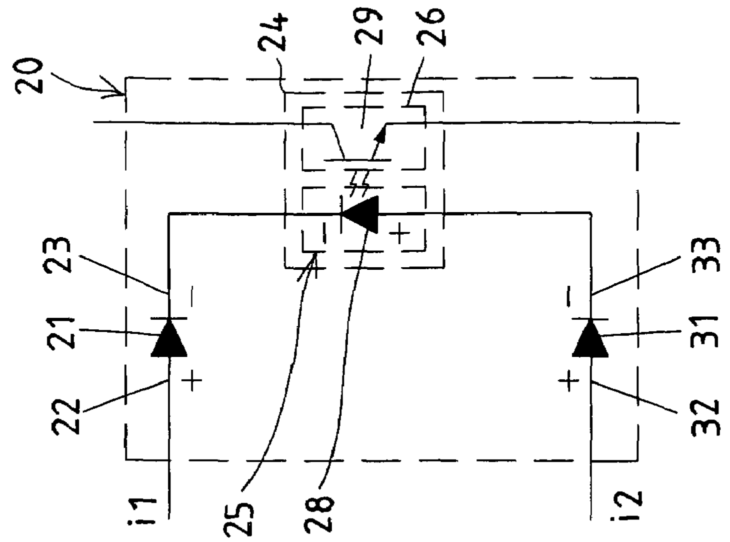
FIG. 3 is a partial plan schematic view similar to FIG. 2, illustrating the other arrangement of the voltage detecting circuit.
Figure 4:
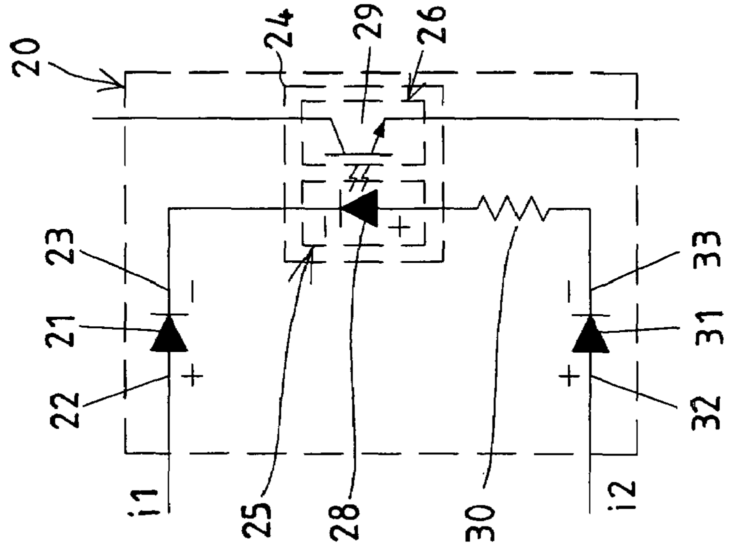
FIG. 4 is a further partial plan schematic view similar to FIGS. 2 and 3, illustrating the further arrangement of the voltage detecting circuit.

As shown in FIG. 3, a divider diode 31 may further be provided and includes the poles 32, 33 arranged identical to that of the input part 25 of the control switch 24, i.e., a positive side 32 coupled to the second terminal or coupling portion 17 and a negative side 33 coupled to the positive side of the photodiode 28 or the input part 25 of the control switch 24 for preventing the control switch 24 from being completely punctured and damaged by the abnormal electric current. The voltage detecting circuit 20 may include a resistor 30 (FIG. 4) or without a resistor (FIG. 3).

Figure 5:
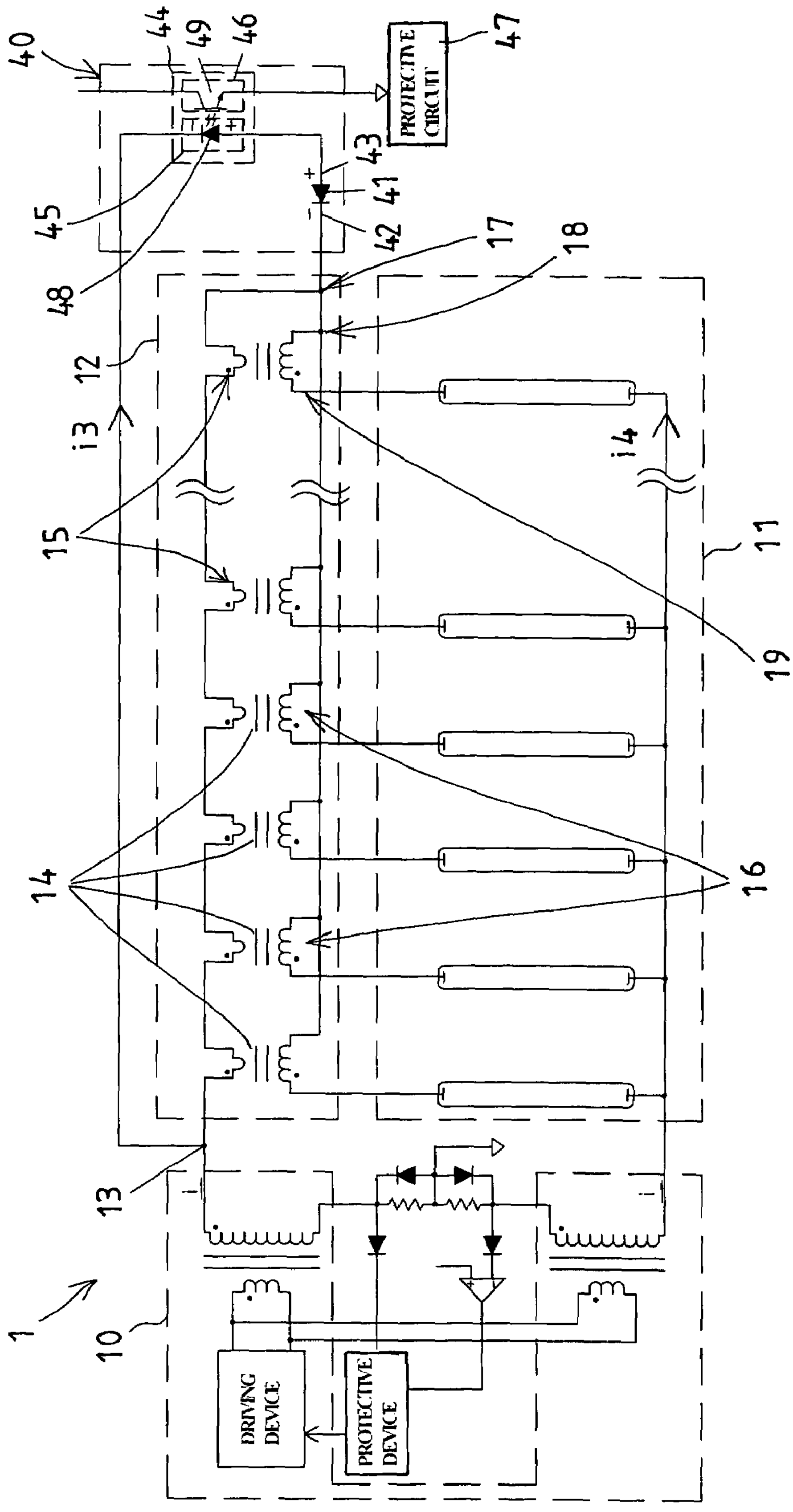
FIG. 5 is a plan schematic view similar to FIG. 1, illustrating the other arrangement of the current balancing circuit.
Figure 6:
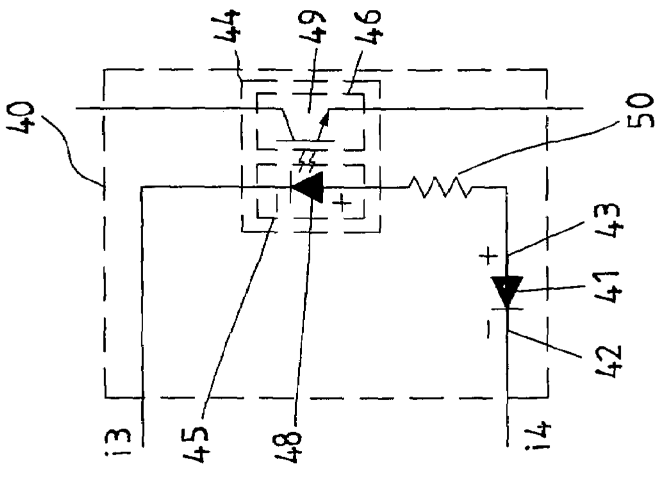
FIG. 6 is a partial plan schematic view of the voltage detecting circuit for the current balancing circuit as shown in FIG. 5.

As shown in FIGS. 5 and 6, alternatively, a voltage detecting circuit 40 may be provided and attached or coupled in parallel to the first and the second terminals or coupling portions 13, 17, and includes a detecting diode 41 having a negative end or side 42 and a positive end or side 43, a control switch 44 having an input part 45 coupled between the detecting diode 41 and the first terminal or coupling portion 13 and having an output part 46 for coupling to a protective circuit 47 or to an electric circuit or facility (not shown) to be controlled or protected with the protective circuit 47. The input part 45 may be or may include a photodiode 48 or the like which includes the poles disposed or arranged opposite to that of the detecting diode 41, and the output part 46 may be or may include a phototransistor 49 or the like.

The negative side 42 of the detecting diode 41 is coupled to the second terminal or coupling portion 17, the positive side 43 of the detecting diode 41 is coupled to the positive side of the photodiode 48 or the input part 45 of the control switch 44; i.e., the photodiode 48 or the input part 45 of the control switch 44 is coupled in series to the detecting diode 41 but disposed or arranged opposite to the detecting diode 41. The inverter 10 may be actuated to supply two currents i3 and i4 alternatively through the first and the second terminals or coupling portions 13, 17 respectively, and/or alternatively through the photodiode 48 or the input part 45 of the control switch 44 and the detecting diode 41 respectively.

The electric current i4 is allowed or limited to flow from the negative side 42 to the positive side 43 of the detecting diode 41, but may not flow from the positive side to the negative side of the photodiode 48 or the input part 45 of the control switch 44 unless the electric current i4 is large enough or reaches the puncturing voltage to actuate or to puncture the photodiode 48 or the input part 45 of the control switch 44, and the phototransistor 49 of the output part 46 may be actuated or operated by the photodiode 48 or the input part 45 of the control switch 44 when the photodiode 48 or the input part 45 of the control switch 44 is punctured by the electric current i4. On the contrary, the electric current i3 is allowed or limited to flow from the negative side to the positive side of the photodiode 48 or the input part 45 of the control switch 44, but may not flow from the positive side 43 to the negative side 42 of the detecting diode 41.

When current balancing circuit 1 works properly, or when the load 11, such as the light tubes are energized properly, or when the currents moving through the load 11 and the balance transformer circuit 12 are balanced, or when the voltage difference between the first and the second terminals or coupling portions 13, 17 is relatively small or less, the voltage of the current i4 will not reach the puncturing voltage and thus may not actuate or puncture the photodiode 48 or the input part 45 of the control switch 44, such that the phototransistor 49 of the output part 46 may not be actuated or operated by the photodiode 48 or the input part 45 of the control switch 44 when the photodiode 48 or the input part 45 of the control switch 44 is not punctured by the electric current i4.

On the contrary, when the load 11 is abnormal or when the light tubes of the load 11 are not energized or operated properly, the currents moving through the primary sides 15 and the secondary sides 16 will be abnormal or unbalanced, and a back electromotive force may be generated and the negative voltage at the other terminals 19 of the secondary sides 16 of the balance transformers 14 will be decreased or will be more negative, such that the voltage difference between the first and the second terminals or coupling portions 13, 17 will also be increased, the electric current i4 may flow through the photodiode 48 or the input part 45 of the control switch 44 at this moment.

In addition, in the previous moment when the electric current i3 flows through the detecting diode 41, a great amount of electricity or electric charges will be accumulated in the detecting diode 41, and simultaneously when the electric current is changed to the electric current i4, the great amount of electricity accumulated in the detecting diode 41 will be released to generate the great negative current 72 (FIG. 10) and the electric current may then flow through the detecting diode 41 and flow backward toward the first terminal or coupling portion 13 to form a circuit. When the electric current i4 flows through the photodiode 48 or the input part 45 of the control switch 44, the photodiode 48 or the input part 45 of the control switch 44 may be actuated or operated to generate a light or a signal in order to actuate or operate the phototransistor 49 of the output part 46 of the control switch 44 and so as to switch off the electric circuit or facility and to protect and to prevent the electric circuit or facility from being damaged by the abnormal voltage.

Figure 8:
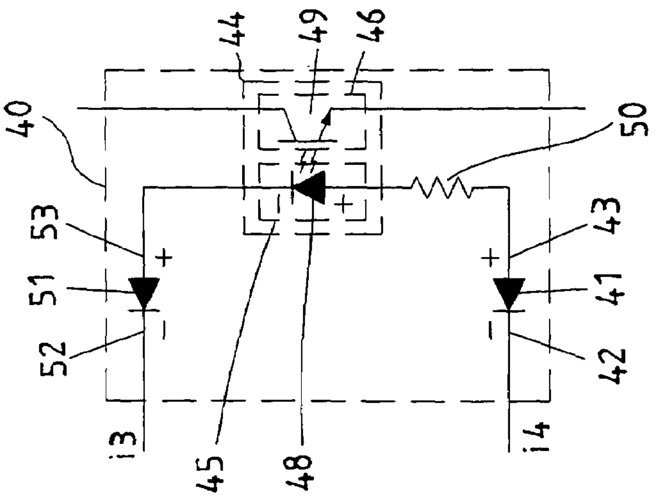
FIG. 8 is a further partial plan schematic view similar to FIGS. 6 and 7, illustrating the further arrangement of the voltage detecting circuit.
Figure 7:
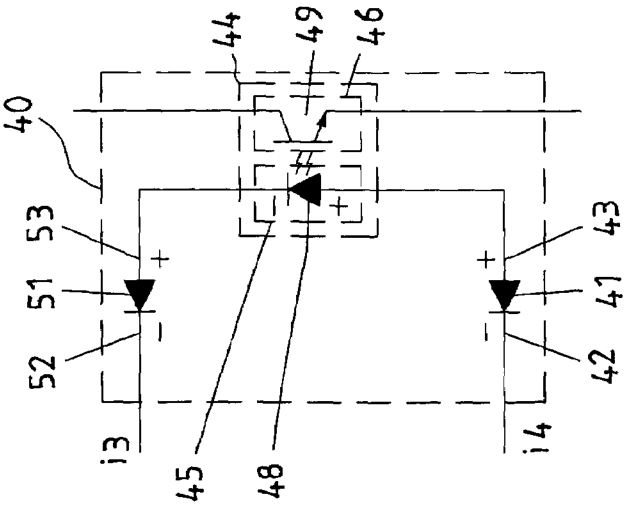
FIG. 7 is a partial plan schematic view similar to FIG. 6, illustrating the other arrangement of the voltage detecting circuit.

As shown in FIG. 6, a resistor 50 may further be provided and coupled between the detecting diode 41 and the photodiode 48 or the input part 45 of the control switch 44 in order to limit the electric current or to prevent the abnormal electric current from flowing through the photodiode 48 or the input part 45 of the control switch 44. As shown in FIG. 7, a divider diode 51 may further be provided and includes a negative side 52 coupled to the first terminal or coupling portion 13 and a positive side 53 coupled to the negative side of the photodiode 48 or the input part 45 of the control switch 44 for preventing the control switch 44 from being completely punctured and damaged by the abnormal electric current. The voltage detecting circuit 40 may include a resistor 50 (FIG. 8) or without a resistor (FIG. 7).

It is to be noted that the current balancing circuit in accordance with the present invention includes fewer parts or elements than that of the typical current balancing circuits which may decrease the manufacturing cost of the current balancing circuit in accordance with the present invention, and the current balancing circuit in accordance with the present invention may be acted or responded quickly and may judge correctly and may be used to switch off the electric circuit or facility and to protect and to prevent the electric circuit or facility from being damaged by the abnormal voltage.

Accordingly, the current balancing circuit in accordance with the present invention includes a simplified voltage detecting circuit for detecting abnormal and/or reverse voltages and for preventing electric circuits or facilities from being damaged by the abnormal and/or reverse voltages.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

We claim:

1. A voltage detecting circuit comprising:

a detecting diode having a positive side and a negative side, and a control switch including an input part and an output part, said input part being a photodiode and coupled in series to said detecting diode and disposed opposite to said detecting diode, said output part coupled to an electric circuit, said photodiode including a negative side coupled to said negative side of said detecting diode for being actuated to generate a signal in order to actuate said output part of said control switch and to switch off said electric circuit when an abnormal voltage is generated.

2. The voltage detecting circuit as claimed in claim 1, wherein said control switch includes a resistor coupled to said input part of said control switch.

3. The voltage detecting circuit as claimed in claim 1, wherein said control switch includes a divider diode coupled to said input part of said control switch.

4. The voltage detecting circuit as claimed in claim 3, wherein said divider diode includes two poles arranged identical to that of said input part of said control switch.

5. The voltage detecting circuit as claimed in claim 3, wherein said input part includes a positive side coupled to a negative side of said divider diode.

6. The voltage detecting circuit as claimed in claim 1, wherein said control switch includes a protective circuit coupled to said output part of said control switch.

* * * * *